United States Patent [19]
Hawes

[11] Patent Number: 5,414,376
[45] Date of Patent: May 9, 1995

[54] PROGRAMMABLE LOGIC DEVICE MACROCELL HAVING EXCLUSIVE LINES FOR FEEDBACK AND EXTERNAL INPUT, AND A NODE WHICH IS SELECTIVELY SHARED FOR REGISTERED OUTPUT AND EXTERNAL INPUT

[75] Inventor: Mark A. Hawes, Boise, Id.

[73] Assignee: Micron Semiconductor, Inc., Boise, Id.

[21] Appl. No.: 289,960

[22] Filed: Aug. 12, 1994

Related U.S. Application Data

[63] Continuation-in-part of Ser. No. 175,162, Dec. 28, 1993.

[51] Int. Cl.[6] .............. H03K 19/177; H03K 19/0175
[52] U.S. Cl. ................................ 326/40; 326/39; 326/62
[58] Field of Search ............ 326/39, 40, 41, 37–38, 326/46, 47, 62, 82

[56] References Cited

U.S. PATENT DOCUMENTS

| | | | |
|---|---|---|---|
| 3,423,646 | 1/1969 | Cubert et al. | 257/30 |
| 4,717,912 | 1/1988 | Harvey et al. | 326/46 |
| 4,742,252 | 5/1988 | Agrawal | 326/39 |
| 4,758,746 | 7/1988 | Birkner et al. | 326/40 |
| 4,763,020 | 8/1988 | Takata et al. | 326/38 |
| 4,771,285 | 9/1988 | Agrawal et al. | 326/38 |
| 5,027,011 | 6/1991 | Steele | 326/40 |
| 5,121,006 | 6/1992 | Pedersen | 326/38 |
| 5,136,188 | 8/1992 | Ha et al. | 326/39 |
| 5,247,195 | 9/1993 | Turner et al. | 326/83 |
| 5,300,830 | 4/1994 | Hawes | 326/39 |

*Primary Examiner*—Edward P. Westin
*Assistant Examiner*—Jon Santamauro
*Attorney, Agent, or Firm*—Angus C. Fox, III

[57] ABSTRACT

An improved programmable logic device (PLD) having a macrocell operable in a registered mode is disclosed. The improved PLD has exclusive lines for both registered feedback and for external input, both of which are fed into a single multiplexer. The output of the multiplexer is fed into the PLD's AND array. The external input line is coupled to the I/O terminal of the macrocell. A tri-state output buffer selectively decouples the I/O terminal from the macrocell output so that the I/O terminal may be employed to alternately receive a registered output signal from the macrocell or to send an external control signal to the AND array.

9 Claims, 2 Drawing Sheets

PROGRAMMABLE LOGIC DEVICE MACROCELL HAVING EXCLUSIVE LINES FOR FEEDBACK AND EXTERNAL INPUT, AND A NODE WHICH IS SELECTIVELY SHARED FOR REGISTERED OUTPUT AND EXTERNAL INPUT

This is a CIP of copending application Ser. No. 08/175,162, filed on Dec. 28, 1993.

CROSS-REFERENCES TO RELATED APPLICATIONS

The following related U.S. patent applications are assigned to Micron Semiconductor, Inc. of Boise, Id.:

application Ser. No. 07/817,167, filed Jan. 6, 1992 for high-speed, zero-power programmable array logic devices;

application Ser. No. 07/865,007, filed Apr. 8, 1992 for a field-programmable logic array with speed-optimized architecture;

application Ser. No. 07/883,076, filed May 15, 1992 for a programmable logic device macrocell with an exclusive feedback line and an exclusive external input line;

application Ser. No. 07/883,078, filed May 15, 1992 for a programmable logic device macrocell with an exclusive feedback line and an exclusive external input line for registered and combinatorial modes using a dedicated product term for control;

application Ser. No. 07/883,759, filed May 15, 1992 for a programmable logic device with a single parameter state decode;

application Ser. No. 07/884,104, filed May 15, 1992 for a field-programmable logic array with two OR planes;

application Ser. No. 07/884,489, filed May 15, 1992 for a programmable logic device macrocell with two OR array inputs; and application Ser. No. 07/884,505, filed May 15, 1992 for a programmable logic device macrocell with an exclusive feedback line and an exclusive external input line for a combinatorial mode and accommodating two separate programmable OR planes.

FIELD OF THE INVENTION

This invention relates to integrated circuits and, more specifically, to field programmable logic arrays (FPLAs). Particularly, an FPLA is disclosed which has exclusive lines for feedback and external input, and a node which is selectively activatable for either a registered output signal or an external input signal.

BACKGROUND OF THE INVENTION

The advent of programmable logic devices (PLDs) represented a significant advance in solid state electronics. With PLDs, it became possible to greatly simplify circuit design, to substitute a single device in place of several, to shrink circuit size, and to reduce power consumption. Traditionally, PLDs have been used in combinational circuits such as address decoders, as well as sequential circuits involving bus artibration schemes. During the past several years, advances and improvements in PLD architectures have made possible devices having greater complexity, density, and speed. In spite of the improvements, PLD architecture still suffers from significant limitations.

A typical PLD combines a user-programmable AND array, a fixed or programmable OR gate or array, a macrocell having output registers or buffers, a feedback path from the output registers or buffers to the AND array, and output terminals.

A programmable logic device with a registered mode macrocell has two logical OR arrays, each of which provides a sum of products term output as an input to the macrocell. The sum of products term output from the first OR array is fed to a register (also called a flip-flop or memory element). The register receives a clock signal input, and output signals from the register are synchronized with the clock signal in order to provide a registered mode output. The sum of products term output from the second OR array does not pass through a register, and is referred to an a combinatorial or combinational mode output.

The existence of a feedback path makes PLDs ideal candidates for state machine implementations. Although a feedback path permits an architecture with which a state machine may be implemented, feedback paths have heretofore been rather inflexible. Specifically, in prior art PLDs having a registered mode macrocell, there is no provision for disabling the output driver in order that the output terminal may be used for the input of external signals used to control the AND array. FIG. 1 depicts a prior art PLD having such an inflexible feedback architecture. When operating in an output mode, the sum of products output from programmable OR array 10 is coupled to output terminal 14 via register 11 and tri-state output buffer 12. Simultaneously, input buffer 16 receives the complement of the registered OR signal via feedback line 18, and transmits this signal to the AND array 15. There is no provision for utilizing output terminal 14 to send external signals to the AND array 15.

In a PLD having a registered mode macrocell, the ability to disable output buffer 12 and utilize output terminal 14 for the input of control signals to the AND array would be very useful. For example, a pre-loadable down counter is often used in a state machine. Thus, it may be desirable for a host computer to access memory for a 256 count and sample the count as it approaches zero. The counter may then be reset to a 172 count which provides a wait period for video boot-up.

For the purpose of providing additional background material which may, in certain respects, illustrate the state of the art, the following books are incorporated herein by reference: *Programmable Logic Handbook*, fourth edition, Monolithic Memories, Inc., 2175 Mission College Blvd., Santa Clara, Calif.; and *Practical Design Using Programmable Logic*, by S. Pellerin and M. Holley, Prentice Hall, Library of Congress No. TK7872 .L64 P44, 1991.

SUMMARY OF THE INVENTION

The present invention is a programmable logic device (PLD) having a macrocell operable in a registered mode. The PLD has exclusive lines for both registered feedback and for external input, both of which are fed into a single multiplexer. The output of the multiplexer is fed into the PLD's AND array. The external input line is coupled to the I/O terminal (also referred to as an I/O pad) of the macrocell. A tri-state output buffer selectively decouples the I/O terminal from the macrocell output so that the I/O terminal may be employed to alternately receive a registered output signal from the macrocell or to send an external control signal to the AND array.

PREFERRED EMBODIMENT OF THE INVENTION

Figure 1:
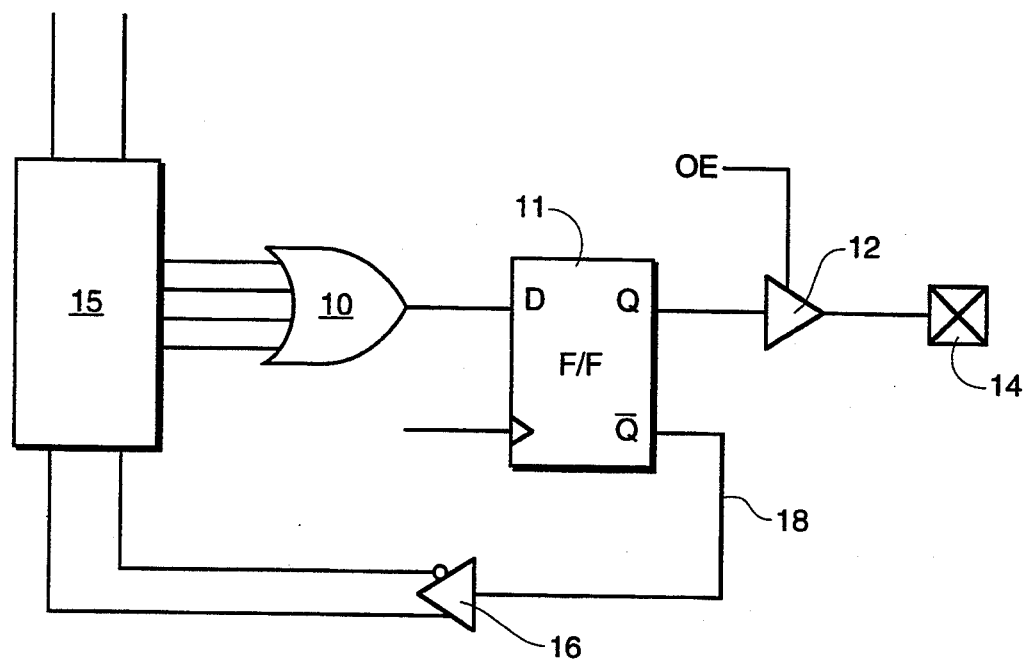
FIG. 1 is an electrical schematic of a prior art programmable logic device having a registered mode macrocell which has no provision for the input of external control signals to the AND array from the macrocell I/O terminal.
Figure 2:
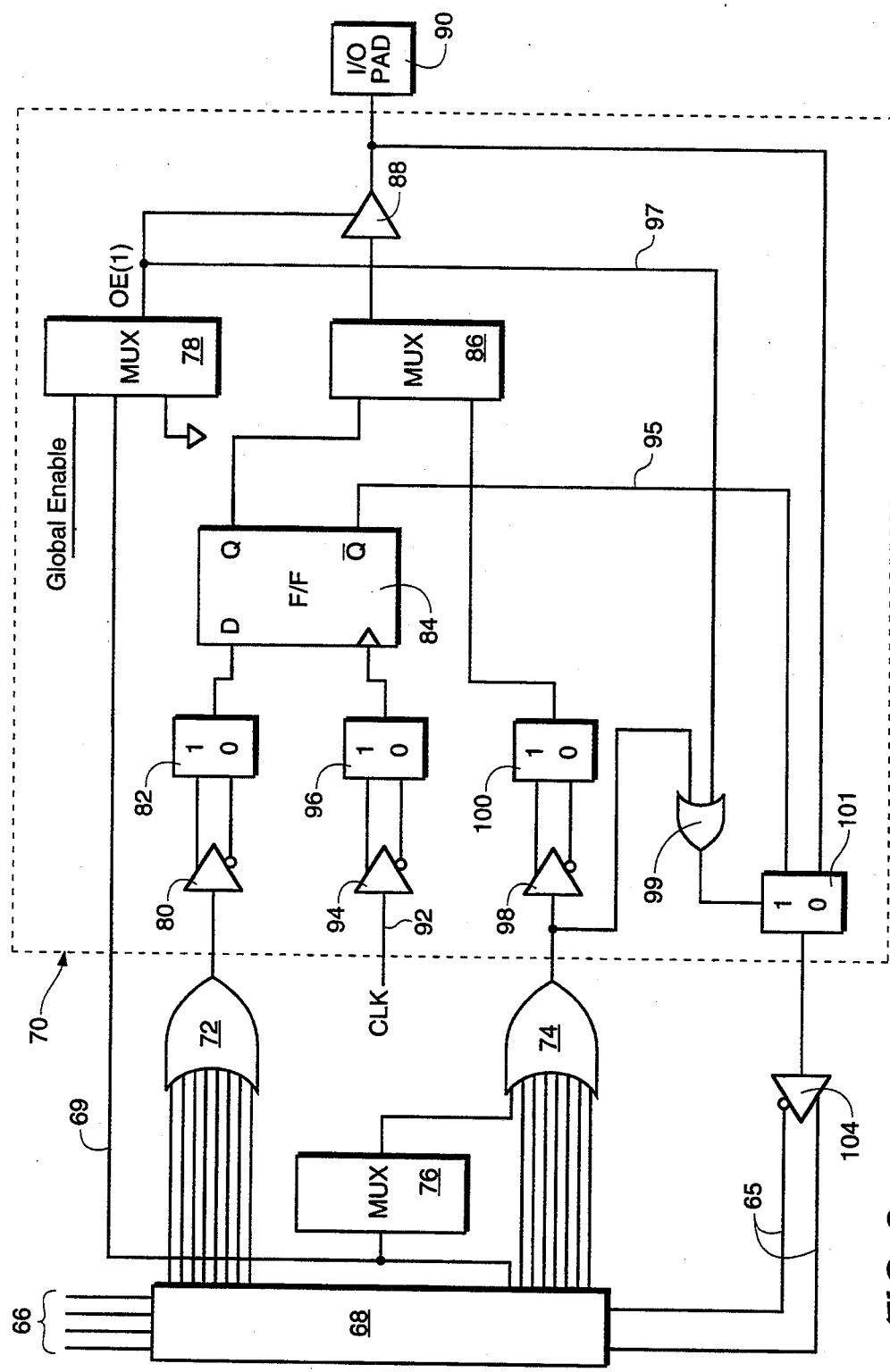
FIG. 2 is an electrical schematic of the new programmable logic device having a registered mode macrocell which includes an exclusive line for external input from the macrocell I/O terminal and a tri-state buffer for selectively coupling the I/O terminal to the macrocell output or the external input line.

The detailed illustration of the invention found in FIG. 2 is meant to be only illustrative and not limiting, particularly with regard to the number of AND array inputs or product term outputs. In FIG. 2, the invention is incorporated in a programmable logic device having a user-programmable AND array 68. The AND array has four normal inputs 66, and a pair of complementary inputs 65. The AND array 68 also has sixteen product PT0–PT15 term outputs, eight of which (PT0–PT7) serve as full-time inputs to a first OR array 72, and seven of which (PT9–PT15) serve as full-time inputs to a second OR array 74. The final product term output PT8 is multiplexed so that it may function as an input to either second OR array 74 or output enable multiplexer 78. The output from output enable multiplexer 78 serves both as the enable signal for tri-state output buffer 88, and as an input signal to OR gate 99. The sum-of-products output SP1 from first OR array 72 is fed to macrocell 70 via a first input buffer 80, which provides both true and complementary signals to a first input multiplexer 82. The output of multiplexer 82 is fed to a register 84, which also receives a clock signal via a second input buffer 94 and a second input multiplexer 96. The true output from register 84 is fed to an output multiplexer 86, while the complement output from register 84 is fed to a special multiplexer 101. The sum-of-products output SP2 from second OR array 74 is fed to macrocell 70 via a third input buffer 98, which provides both true and complementary signals to a third input multiplexer 100. The output of multiplexer 100 is fed to output multiplexer 86. The sum-of-products output SP2 from second OR array 74 is also fed to OR gate 99. The output of output multiplexer 86 is coupled, via tri-statable buffer 88, to both an I/O terminal 90 and to the special multiplexer 101. The output of multiplexer 101 becomes, after passing through driver 104, the pair of complementary inputs 65. These complementary inputs, depending on the value of the output of OR gate 99, are either registered signals originating from register 84 or external input signals delivered over line 97 from I/O terminal 90. When the output of OR gate 99 is a logical "1", the exclusive feedback signal 95 is active. Conversely, when the output of OR gate 99 is a logical "0", the exclusive external input signal is active.

The operation of the circuit of FIG. 2 is straightforward. There are essentially three principal modes of operation. The first state corresponds to a logical "1" output from multiplexer 78. When this occurs, tri-state buffer 88 passes the registered or unregistered output of output multiplexer 86, whether a logical "1" or a logical "0". A logical "1" output from multiplexer 78 also enables the exclusive feedback path 95 from register 84 to input driver 104. The second state corresponds to a logical "0" output from multiplexer 78 and a logical "0" sum-of-products output from second OR array 74. When this occurs, tri-state buffer 88 is in a high impedance state, and the exclusive feedback path 95 from register 84 is disabled. Thus, an external signal applied to I/O terminal 90 will be sent to input buffer 104 over the exclusive external input line. The third state corresponds to a logical "0" output from multiplexer 78 and a logical "1" sum-of-products output from second OR array 74. When this occurs, tri-state buffer 88 is in a high impedance state, the output from multiplexer 86 is disabled, and the registered feedback signal on line 95 is passed to input buffer 104, regardless of the external signal on I/O terminal 90.

Although only a single embodiment of the invention has been described herein, it will be obvious to those of ordinary skill in the art of programmable logic devices that changes and modifications may be made thereto without departing from the spirit and the scope of the invention as hereinafter claimed. For example, the invention may also be incorporated in a PLD having a macrocell which is exclusively registered. In such a PLD, multiplexer 86 may be eliminated, with tri-statable buffer 88 being directly coupled to register 84. In addition, the third input buffer 98 and the third input multiplexer 100 may also be eliminated, with the second sum of products term from second OR array 74 being directly coupled to OR gate 99.

What is claimed is:

1. A programmable logic device comprising:
   a) an AND array having multiple inputs and multiple product term outputs;
   b) first and second OR arrays, each OR array receiving, as inputs, product term outputs from the AND array, each OR array having a single sum-of products output; and
   c) an output macrocell having
      c1) a first input for receiving the sum-of-products output from the first OR array;
      c2) a second input for receiving the sum-of-products output from the second OR array;
      c3) a third input for receiving a single product term output from the AND array;
      c4) means for generating a registered signal, said means for generating having a first input coupled to the sum-of-products output of said first OR array, and a second input coupled to a clock signal;
      c5) a first multiplexer having a first input for receiving the registered signal, and a second input for receiving a non-registered signal derived from the sum-of-products term output of said second OR array, said first multiplexer having an output, and being operable so as to select between the registered signal and the non-registered signal, and providing the signal so selected at its output;
      c6) a tri-statable buffer which either couples the selected signal to an input/output terminal or decouples the selected signal from the input/output terminal, said tri-statable buffer being controlled by said single product term output from the AND array;
      c7) a logic gate having an output, a first input coupled to the sum-of-products term output of said second OR array, and a second input coupled to the single product term output from the AND array; and c8) a second multiplexer having an output coupled to at least one of said inputs of said AND array, said second multiplexer also having first and second inputs, said first input being coupled to said means for generating, and said second input being coupled to the input/output terminal, said second multiplexer being controlled by the output of said logic gate.

2. The programmable logic device of claim 1, wherein said single product term is also coupled to one of said plurality of inputs to said second OR array via a third multiplexer.

3. The programmable logic device of claim 1, wherein said logic gate is an OR gate.

4. A programmable logic device comprising:
(a) an AND array having multiple inputs and multiple product term outputs;
(b) a first OR array having a first single sum-of-products output, and also having multiple inputs comprising a plurality of product term outputs from said AND array;
(c) a second OR array having a second single sum-of-products output, and also having multiple inputs comprising a plurality of product term outputs from said AND array;
(d) means for receiving a clock signal;
(e) an output macrocell having;
 (1) a first macrocell input corresponding to said first single sum-of-products output;
 (2) a second macrocell input corresponding to said second single sum-of-products output;
 (3) a third macrocell input corresponding to a single product term output from said AND array;
 (4) means for generating a registered signal, said means for generating having at least first and second inputs, the first input of said means for generating being coupled to said first single sum-of-products output, and the second input of said means for generating being coupled to said clock signal;
 (5) a first multiplexer for selecting between the registered signal and a non-registered signal derived from said second single sum-of-products output, said first multiplexer having an output providing a signal so selected;
 (6) a tri-statable buffer which either couples the selected signal to an input/output terminal or decouples the selected signal from the input/output terminal, said tri-statable buffer being controlled by said single product term output;
 (7) a logic gate having an output, a first input coupled to said second single sum-of-products output, and a second input coupled to said single product term output; and
 (8) a second multiplexer having an output coupled to at least one of said inputs of said AND array, and first and second inputs, said first input being coupled to the output of said means for generating, and said second input being coupled to the input/output terminal, said second multiplexer being controlled by the output of said logic gate.

5. The programmable logic device of claim 4, wherein said single product term is also coupled to one of said plurality of inputs to said second OR array via a third multiplexer.

6. The programmable logic device of claim 4, wherein said logic gate is an OR gate.

7. A programmable logic device comprising:
(a) an AND array having multiple inputs and multiple product term outputs;
(b) a first OR array having a first single sum-of-products output, and also having multiple inputs comprising a plurality of product term outputs from said AND array;
(c) a second OR array having a second single sum-of-products output, and also having multiple inputs comprising a plurality of product term outputs from said AND array;
(d) means for receiving a clock signal;
(e) an output macrocell having;
 (1) a first macrocell input corresponding to said first single sum-of-products output;
 (2) a second macrocell input corresponding to said second single sum-of-products output;
 (3) a third macrocell input corresponding to a single product term output from said AND array;
 (4) means for generating a registered signal, said means for generating having at least first and second inputs, the first input of said means for generating being coupled to said first single sum-of-products output, and the second input of said means for generating being coupled to said clock signal;
 (5) a tri-statable buffer which either couples the registered signal to an input/output terminal or decouples the registered signal from the input/output terminal, said tri-statable buffer being controlled by said single product term output;
 (6) a logic gate having an output, a first input coupled to said second single sum-of-products output, and a second input coupled to said single product term output; and
 (7) a first multiplexer having an output coupled to at least one of said inputs of said AND array, and first and second inputs, said first input being coupled to the output of said means for generating, and said second input being coupled to the input/output terminal, said first multiplexer being controlled by the output of said logic gate.

8. The programmable logic device of claim 7, wherein said single product term is also coupled to one of said plurality of inputs to said second OR array via a second multiplexer.

9. The programmable logic device of claim 7, wherein said logic gate is an OR gate.

* * * * *